(12) United States Patent
Rumer et al.

(10) Patent No.: US 6,911,726 B2
(45) Date of Patent: Jun. 28, 2005

(54) MICROELECTRONIC PACKAGING AND METHODS FOR THERMALLY PROTECTING PACKAGE INTERCONNECTS AND COMPONENTS

(75) Inventors: Christopher L. Rumer, Chandler, AZ (US); Saikumar Jayaraman, Chandler, AZ (US)

(73) Assignee: Intel Corporation, Hillsboro, OR (US)

( * ) Notice: Subject to any disclaimer, the term of this patent is extended or adjusted under 35 U.S.C. 154(b) by 29 days.

(21) Appl. No.: 10/165,401

(22) Filed: Jun. 7, 2002

(65) Prior Publication Data

US 2003/0227066 A1 Dec. 11, 2003

(51) Int. Cl.$^7$ .............................................. H01L 23/48
(52) U.S. Cl. ....................... 257/697; 257/690; 257/781; 257/783; 257/792
(58) Field of Search ................................. 257/697, 690, 257/781, 783, 792, 503, 778, 776

(56) References Cited

U.S. PATENT DOCUMENTS

| | | | | |
|---|---|---|---|---|
| 4,268,585 A | * | 5/1981 | Daur et al. ................. 428/622 |
| 4,584,328 A | * | 4/1986 | Madono ..................... 523/145 |
| 5,189,507 A | * | 2/1993 | Carlomagno et al. ....... 257/777 |
| 5,288,944 A | * | 2/1994 | Bronson et al. ........... 174/52.4 |
| 5,432,675 A | * | 7/1995 | Sorimachi et al. .......... 361/719 |
| 5,471,027 A | * | 11/1995 | Call et al. ................ 219/85.13 |
| 5,639,696 A | * | 6/1997 | Liang et al. ........... 228/180.22 |
| 5,764,485 A | * | 6/1998 | Lebaschi .................... 361/774 |
| 5,998,861 A | * | 12/1999 | Hiruta ........................ 257/700 |
| 6,054,652 A | * | 4/2000 | Moriizumi et al. ......... 174/261 |
| 6,218,730 B1 | * | 4/2001 | Toy et al. .................... 257/704 |
| 6,259,155 B1 | * | 7/2001 | Interrante et al. ........... 257/690 |
| 6,300,678 B1 | * | 10/2001 | Suehiro et al. ............. 257/697 |
| 6,329,610 B1 | * | 12/2001 | Takubo et al. .............. 174/264 |
| 6,330,166 B1 | * | 12/2001 | Aoyama et al. ............ 361/760 |
| 6,376,917 B1 | * | 4/2002 | Takeshita et al. ........... 257/778 |
| 6,413,353 B2 | * | 7/2002 | Pompeo et al. .......... 156/307.3 |
| 6,437,990 B1 | * | 8/2002 | Degani et al. .............. 361/783 |
| 6,548,898 B2 | * | 4/2003 | Matsuki et al. ............. 257/746 |
| 6,600,233 B2 | * | 7/2003 | Yeoh et al. ................. 257/779 |
| 6,610,934 B2 | * | 8/2003 | Yamaguchi et al. ........ 174/264 |
| 6,648,211 B2 | * | 11/2003 | Saiki et al. .............. 228/180.1 |

* cited by examiner

*Primary Examiner*—Tom Thomas
*Assistant Examiner*—Eugene Lee
(74) *Attorney, Agent, or Firm*—Schwabe, Williamson & Wyatt, P.C.

(57) ABSTRACT

Apparatus and methods are provided wherein the reflowable electrically conductive interconnect material coupling the interconnects and/or land-side components of a microelectronic package is protected from elevated temperatures, such as those associated with reflow processes and environments which exceed the melting temperature of the interconnect material. One embodiment of the method provides covering the interconnect material about the interconnects and/or land-side components with heat-resistant curable material which protects the interconnect material from the elevated temperature and provides structural support to the interconnects and/or land-side components at the elevated temperature. One embodiment of the apparatus provides a substrate comprising interconnects and/or land-side components coupled to a carrier substrate with reflowable electrically conductive interconnect material, and a layer of heat-resistant curable material covering the interconnect material and forming fillets about the interconnects and/or land-side components.

14 Claims, 13 Drawing Sheets

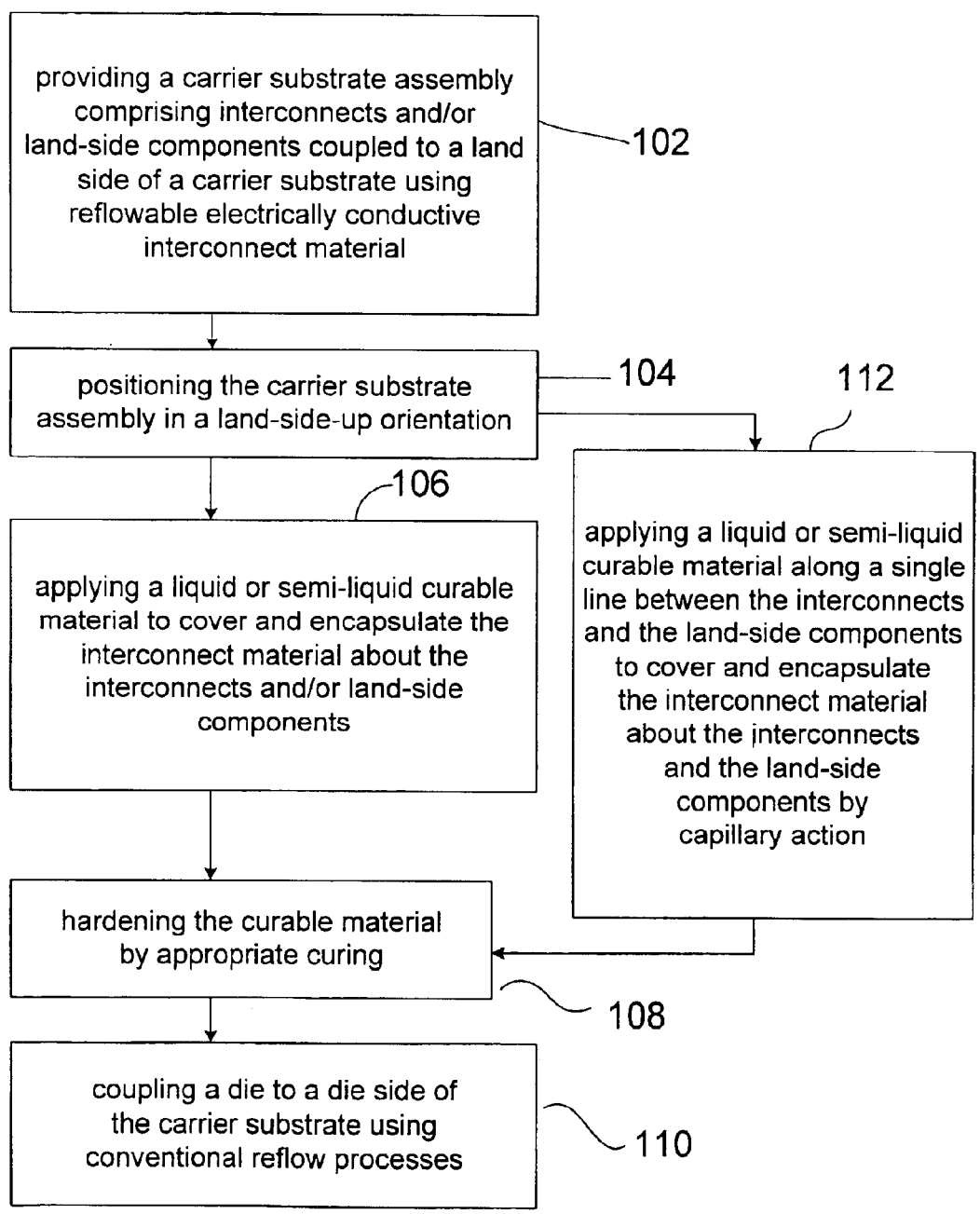

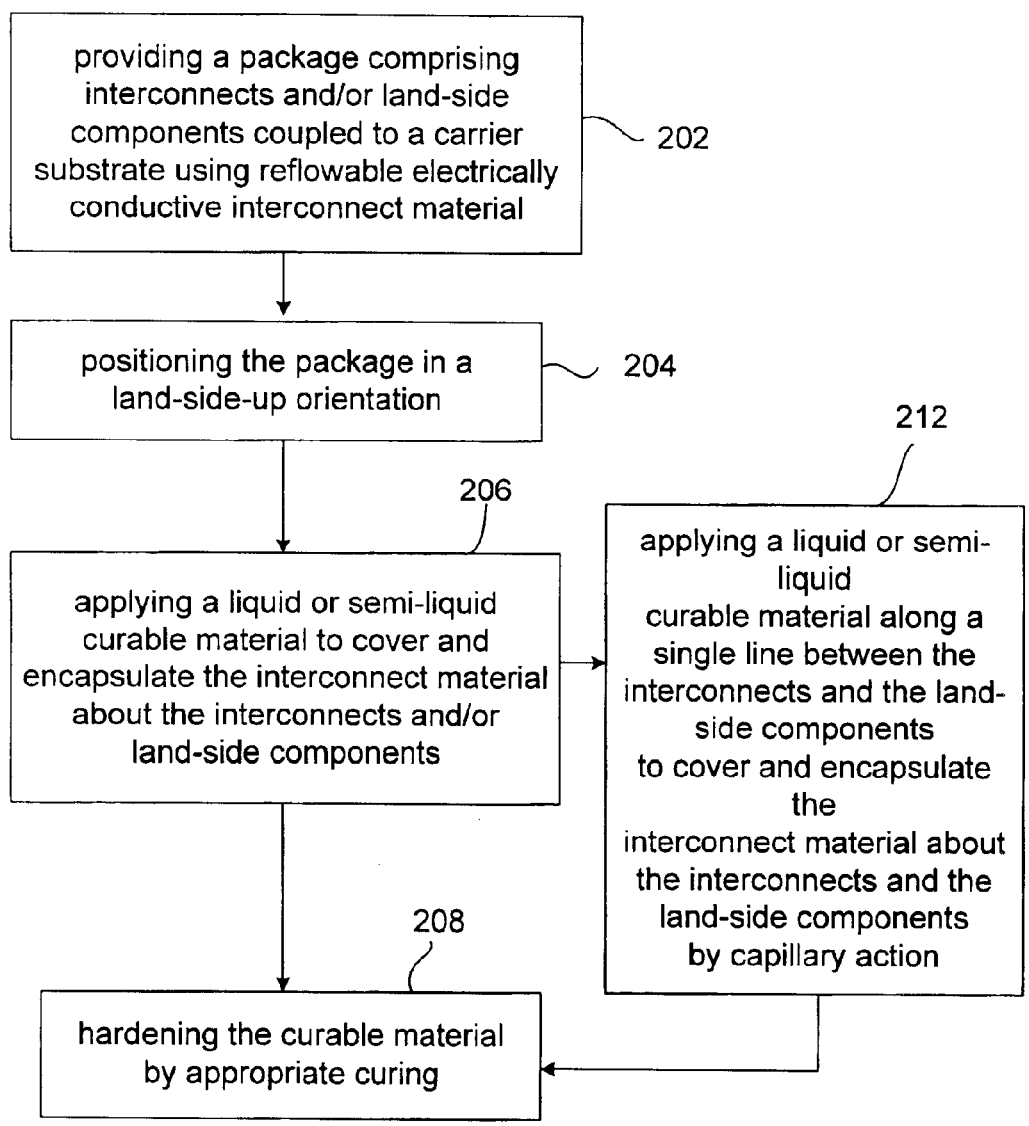

MICROELECTRONIC PACKAGING AND METHODS FOR THERMALLY PROTECTING PACKAGE INTERCONNECTS AND COMPONENTS

FIELD OF THE INVENTION

The present invention relates to microelectronic packaging and, more particularly, to packaging and methods for thermally protecting the microelectronic package interconnects/components to prevent misalignment and damage during high temperature reflow processing.

BACKGROUND OF INVENTION

A microelectronic die comprises multiple interconnected microcircuits within a single carrier to perform electronic circuit functions. Electrical communication between the microcircuits and external components is provided through an array of a plurality of very small, tightly spaced bond pads located on an active side of the die. The conduit used to facilitate electrical communication with external components is commonly a substrate with electrically conductive paths, examples of which include a printed circuit board (PCB) and a mother board, among others.

In many cases, the physical characteristics of the die and the substrate prohibit direct attachment. Therefore, a process commonly used provides that the die is first coupled to a carrier substrate that is more suitable for attachment to the substrate. The combination of a die coupled to a carrier substrate is known in the art as a microelectronic device. The combination of a microelectronic device and other components, such as a heat dissipation device and interconnects, among others, is known as a package. The package provides a number of advantages over the direct connection of the die to the substrate, some of which include ease of handling and assembling, improved electrical integrity, protection from environmental contaminants, removability, among others.

One example of packaging that is becoming increasingly used in the art is flip chip-pin grid array (FC-PGA) packaging. In FC-PGA packaging, a carrier substrate is provided with a die-facing side and a land side. The die-facing side comprises an array of die land-pads in complimentary relationship with the bond pads of the die. The die-to-carrier substrate electrical interconnection is made using any known reflow technique, for example, the controlled collapse chip connection (C4) process, among others. The C4 process uses reflowable electrically conductive interconnect material in the form of solder balls with diameters ranging from 100 to 125 microns as a die-to-carrier substrate interconnect. The interconnect material is deposited onto the bond pads, and the die is placed, interconnect material facing down, onto the respective die land-pads. The device is exposed to an elevated temperature during the reflow process, wherein the interconnect material softens and/or melts into a shape controlled by the surface tension of the liquid interconnect material. Upon cooling, the interconnect material solidifies and couples together the bond pads and the die land-pads.

The land side of the carrier substrate of a FC-PGA package provides an array of interconnects in the form of pins, coupled to interconnect land-pads using reflowable electrically conductive interconnect material. The pins are robust and allow for removably mounting the package to a substrate that has an appropriate pin socket. The array of interconnects can be arranged in many configurations, two of which include an area array, wherein the interconnects substantially cover the entire land side, and peripheral array, wherein the interconnects encircle an outer portion of the land side leaving a clear central portion.

In addition to the interconnects, land-side components such as capacitors and resistors are commonly coupled to the land side. These land-side components are coupled to component land pads using reflow techniques, commonly during the same reflow process as the coupling of the interconnects.

Present FC-PGA packaging techniques couple the die to the carrier substrate prior to the coupling of the interconnects/components. This is done since the reflow temperature used to couple the die to the carrier substrate is commonly higher than the melting temperature of the interconnect material used to couple the interconnects/components. For example, lead-free solder used as interconnect material for coupling the die to the carrier substrate has a reflow temperature approaching 260 C., exceeding the melting temperature of 234 C for 95Sn5Sb solder which is typically used as interconnect material to couple the interconnects/components. Therefore, the interconnects/components are coupled to the carrier substrate after die coupling to prevent coupling failure such as misalignment and detachment due to the high reflow temperature of the die coupling process.

The practice of coupling the interconnects/components to the carrier substrate after the coupling of the die presents a number of problems. For example, the die and carrier substrate are subjected to the thermal cycling of the second reflow process used for coupling the interconnects/components, potentially weakening the delicate die-to-carrier substrate interconnect. Also, if the package is rejected due to quality issues regarding the coupling of the interconnects/components, a labor intensive rework process to realign/reattach the interconnects/components might be required in order to "save" the package. Otherwise, the entire package, including the valuable die, could be scrapped.

The benefits of coupling the interconnects/components prior to coupling the die to the carrier substrate are many. For example, among others, the coupling quality of the interconnects/components can be evaluated, and if rejected, the assembly can be scrapped at little cost, without scrapping the die. This negates the need for labor intensive rework to "save" the package. Also, the coupling of the interconnects/components can be performed by the carrier substrate manufacturer, relieving the die coupling manufacturer from additional process and quality control steps. Additionally, processing costs can be dramatically reduced, as well as providing faster throughput and easier handling, by attaching the interconnects/components to a panel comprising multiple carrier substrates; that is, prior to singulating the individual carrier substrates from the panel.

Methods and apparatus are needed to provide for the coupling of interconnects/components to the carrier substrate prior to the coupling of the microelectronic die to the carrier substrate. Further, methods and apparatus are needed to protect the integrity of the coupling between the interconnects/components to the carrier substrate for high temperature applications.

BRIEF DESCRIPTION OF DRAWINGS

FIG. 1 is a flow diagram of a method in accordance with an embodiment of the invention;

FIG. 6 is a flow diagram of another embodiment of the method in accordance with the invention;

DESCRIPTION

Figure 2A:
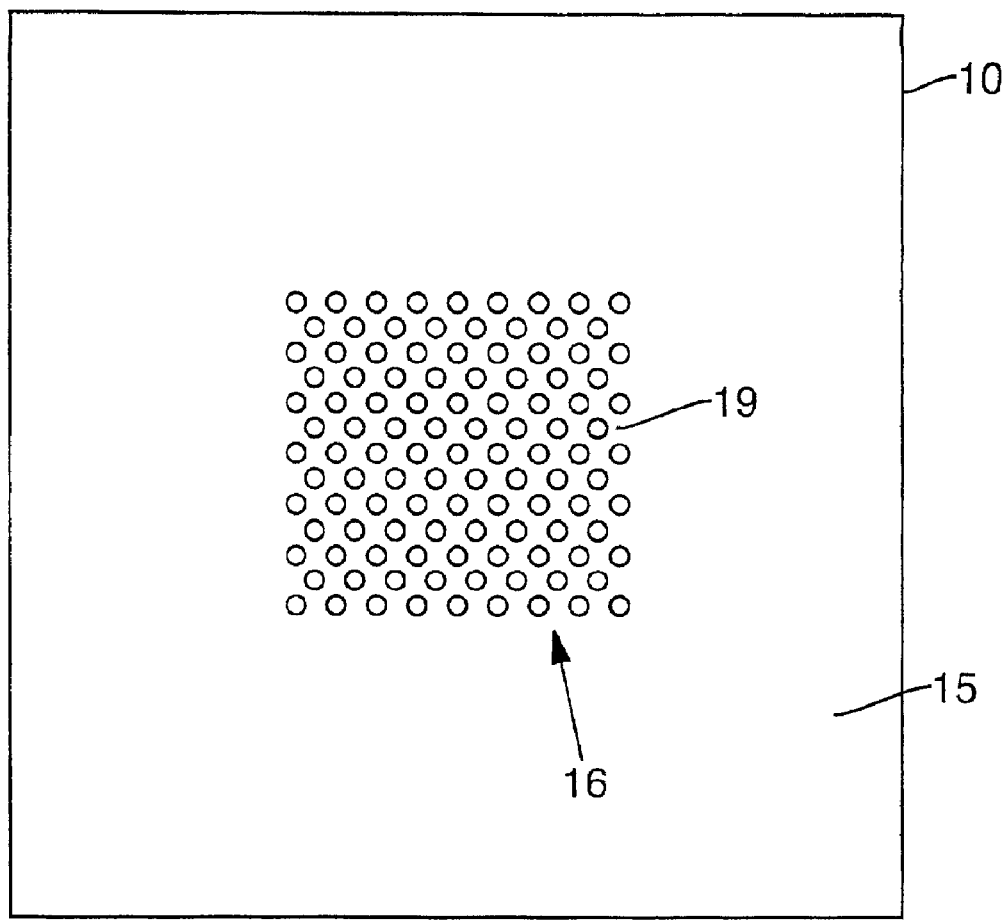
FIGS. 2A and 2B are top and bottom views of a carrier substrate comprising a die side and a land side, respectively.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention.

The following description illustrates the application of the invention as it applies to flip chip-pin grid array (FC-PGA) packaging. It is understood that the inventive apparatus and methods can be used with and benefit other packaging technologies. Other packaging technologies that benefit from the inventive apparatus and methods include, but not limited to, ball grid array packaging and organic land grid array packaging. Therefore, the following detailed description is not to be taken in a limiting sense, and the scope of the present invention is defined by the appended claims and their equivalents.

FIG. 1 is a flow diagram of a method 100 in accordance with an embodiment of the invention. The method 100 involves coupling the interconnects and/or land-side components to a carrier substrate using reflowable electrically conductive interconnect material prior to the reflow process used to couple the die to a carrier substrate. The interconnect material coupling the interconnects and/or land-side components to the carrier substrate is covered with curable material which produces a hard coating to protect the interconnect material from and support the interconnects and/or land-side components during the high temperature used in the reflow process to couple the die to the carrier substrate.

In accordance with the method 100, a carrier substrate assembly is provided comprising interconnects and/or land-side components coupled to a land side of a carrier substrate using reflowable electrically conductive interconnect material 102. The carrier substrate assembly is positioned in a land-side-up orientation 104. A liquid or semi-liquid curable material is applied to cover and encapsulate the interconnect material about the interconnects and/or land-side components 106. The curable material is hardened by appropriate curing 108. A die is coupled to a die side of the carrier substrate using conventional reflow processes 110, or other processes known in the art.

In accordance with another embodiment of the method 100, a carrier substrate assembly is provided comprising interconnects and/or land-side components coupled to the land side of a carrier substrate using reflowable electrically conductive interconnect material 102. The carrier substrate assembly is positioned in a land-side-up orientation 104. A liquid or semi-liquid curable material is applied along a single line between the interconnects and the land-side components to cover and encapsulate the interconnect material about the interconnects and the land-side components by capillary action 112. The curable material is hardened by appropriate curing 108. A die is coupled to a die side of the carrier substrate using conventional reflow processes 110 or other processes known in the art.

Figure 2B:
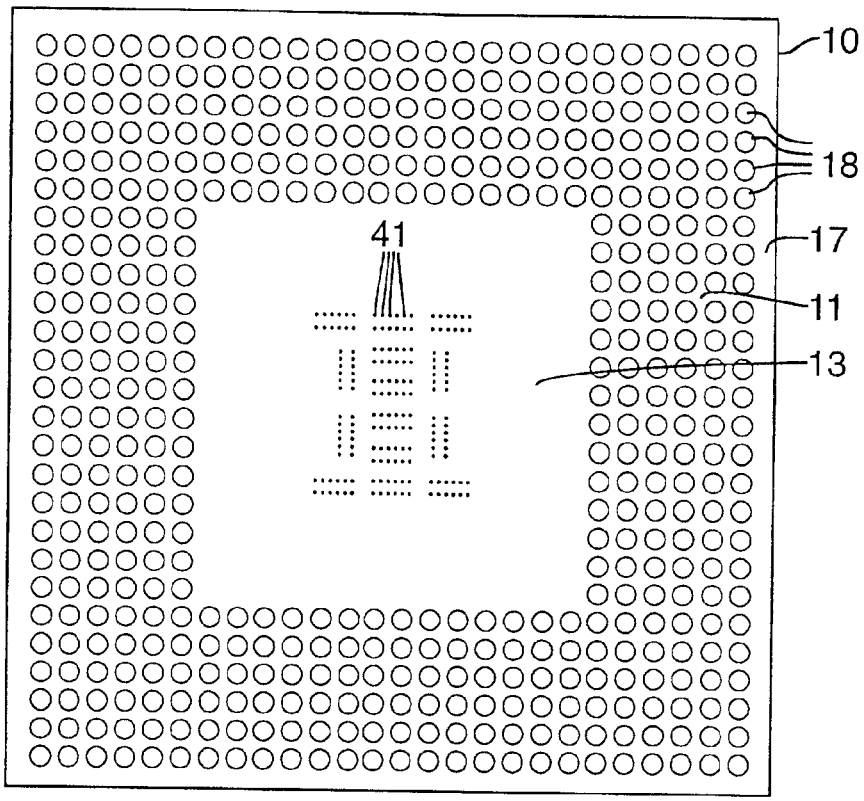

FIGS. 2A and 2B are top and bottom views of a carrier substrate 10 having a die side 15 and a land side 17, respectively, commonly found in the art. The die side 15 comprises die land pads 16 oriented in an array. The land side 17 comprises an outer portion 11 having an array of interconnect land-pads 18 and a central portion 13 having an array of component land-pads 41.

Figure 2C:
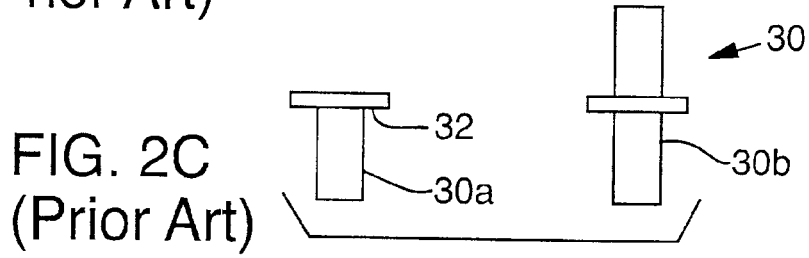
FIG. 2C is a side view of two types of interconnects.

FIG. 2C is a side view of two common types of interconnects 30 used for FC-BGA packaging; a flat-headed pin 30a having a head 32, and a through-hole pin 30b. The flat-headed pin 30a is appropriate for flat interconnect land-pads and the through-hole pin 30b is appropriate for through-hole interconnect land-pads. These are simply examples of interconnects 30, and the methods and apparatus of the present invention may be practiced regardless of the style of the interconnects 30. The element "interconnect land-pad" is used herein to represent any electrical contact member on the carrier substrate 10 adapted to couple with any type of interconnect 30.

Figure 2D:
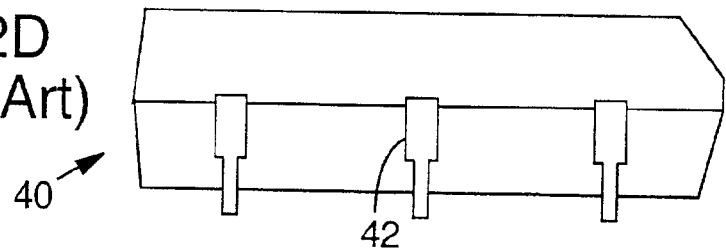
FIG. 2D is a side view of a land-side component.

FIG. 2D is a side view of a generic representation of a land-side component 40 having interconnect legs 42 adapted to couple with the component land-pads 41. The interconnects 30 and land-side components 40 are coupled to the interconnect land-pads 18 and component land-pads 41, respectively, in accordance with well known reflow techniques using reflowable electrically conductive interconnect material.

Figure 2E:
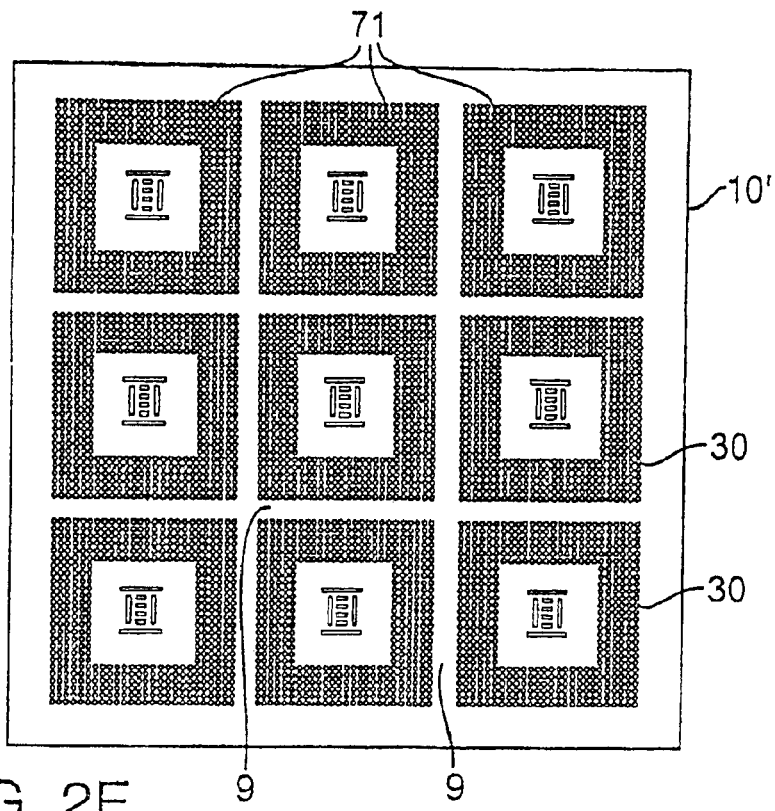
FIG. 2E is a land-side view of a panel comprising multiple substrates in accordance with an embodiment of the invention.
Figure 3:
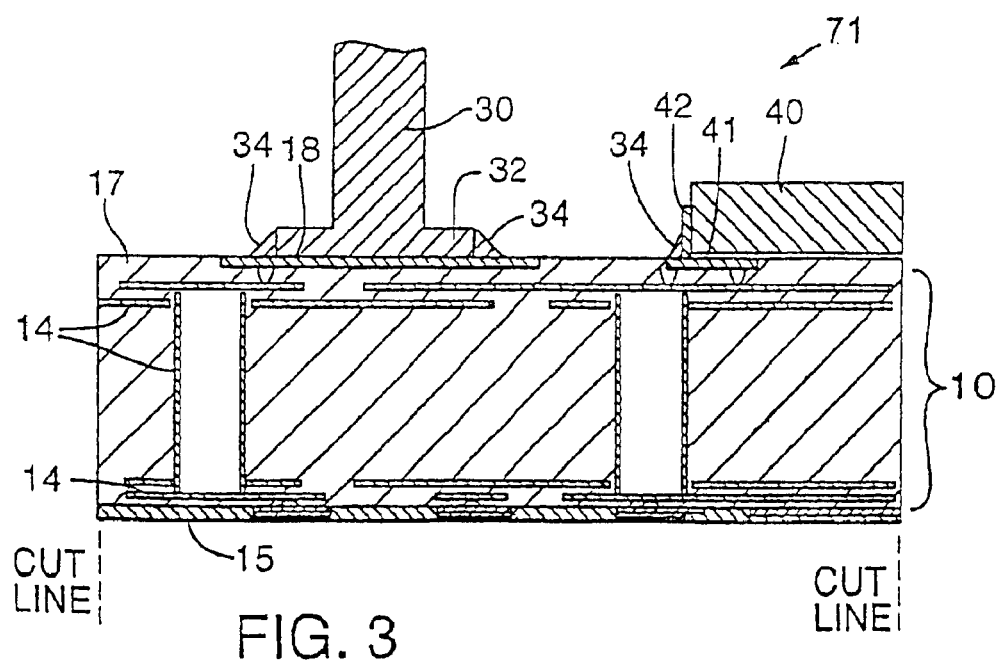
FIG. 3 is a partial cross-sectional view of a carrier substrate comprising interconnects/components in accordance with an embodiment of the invention.

FIG. 3 is a cross sectional view of a portion of a carrier assembly 71 comprising interconnects 30 and land-side components 40 coupled to interconnect land-pads 18 and component land-pads 41, respectively, with interconnect material 34 in accordance with an embodiment of the invention. In one embodiment, the interconnects 30 and land-side components 40 can be coupled on an individual carrier substrate 10 as shown in FIG. 2B, or, in another embodiment, as a panel 10' as shown in FIG. 2E, wherein multiple carrier assemblies 71 are produced from a single panel 10'. Subsequent to the coupling of the interconnects 30 and land-side components 40, individual carrier substrates 10 are singulated or separated from the panel 10', or in another embodiment, remain as a panel 10' for further processing.

A reflowable electrically conductive interconnect material 34 commonly used to couple the interconnects 30 and the land-side components 40 to the carrier substrate 10, is a tin-based solder comprising 37% lead (Sn/37Pb solder) having a melting temperature of 183 C. A typical reflow temperature for Sn/37Pb solder is 205 C. In the industry push to use lead-free solder, a tin-based solder is being used that comprises 3.5% silver (Sn/3.5Ag solder) having a melting temperature of 221 C and a reflow temperature of 240 C. Another lead-free solder that is being used is a tin-based solder comprising 5% antimony (Sn/5Sb solder) having a melting temperature of 234 C and a reflow temperature of 255 C. One can appreciate that if the die is coupled to the carrier substrate 10 using a higher melting temperature solder subsequent to the coupling of the interconnects/components 30,40 with a lower melting temperature solder, the interconnect material 34 coupling the interconnects/components 30,40 will be exposed to temperatures exceeding the melting temperature potentially causing coupling failure, such as misalignment or de-coupling of the interconnects/components 30,40 from the carrier substrate 10.

Figure 4A:
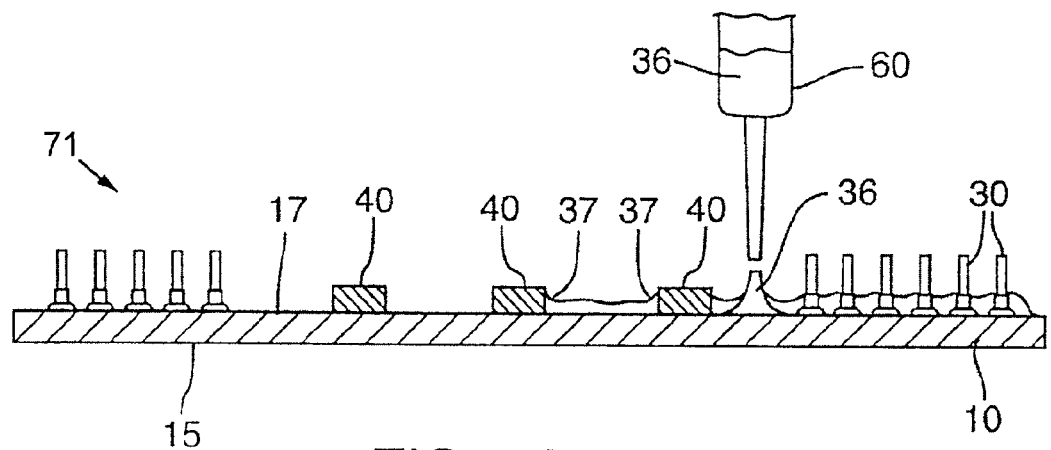
FIGS. 4A–4C are cross-sectional, land side, and partial cross-sectional views, respectively, of a carrier substrate comprising interconnects/components and a curable material layer, in accordance with an embodiment of the invention.
Figure 4B:
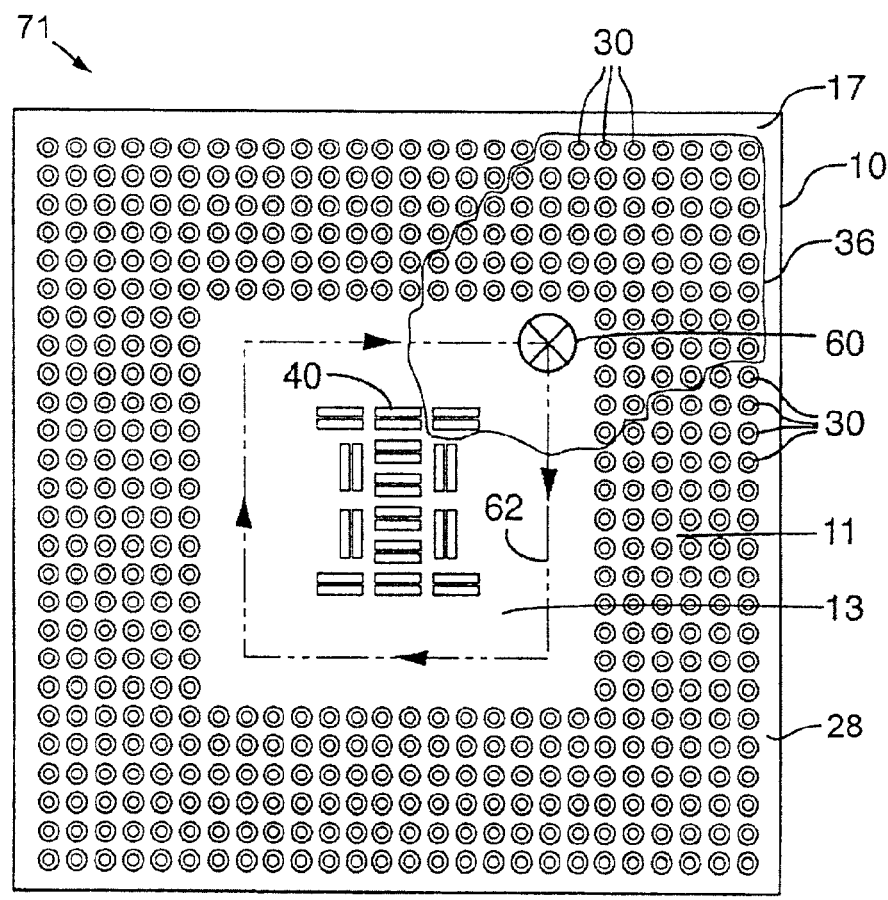
Figure 4C:
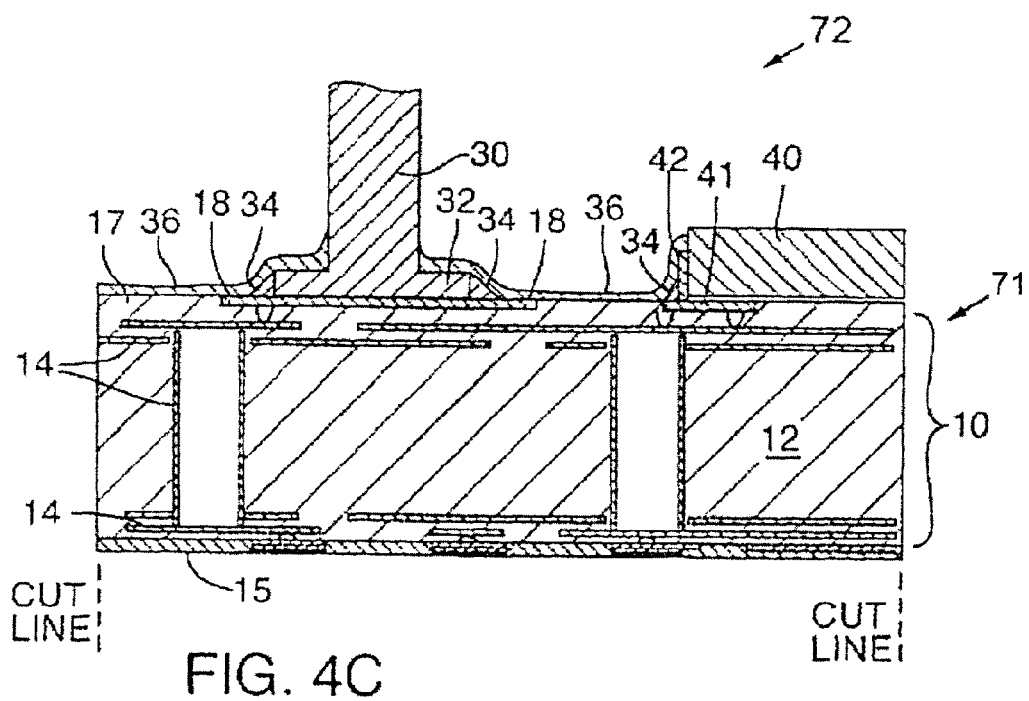

FIGS. 4A–4C are cross-sectional, land side, and partial cross-sectional views, respectively, of the carrier assembly 71 and encapsulated carrier assembly 72, respectively, illustrating a process of encapsulating the interconnect material 34 about the interconnects 30 and land-side components 40, in accordance with an embodiment of the invention. While the carrier assembly 71 is held in a land-side-up orientation, an applicator 60 applies a curable material 36 to the land side 17 such that the interconnect material 34 is covered with a layer of the curable material 36. The applicator 60, in accordance with another embodiment of the invention, warms the curable material 36 prior to application to improve the flow of the curable material 36 over the surface of the land side 17.

In one embodiment, a curable material 36 having a predetermined viscosity is applied at one location of the land side 17, and, via capillary action, the curable material 36 spreads and covers the interconnect material 34 about the interconnects 30 and land-side components 40. In another embodiment, a curable material 36 having a predetermined viscosity is applied by moving the applicator 60 about and between the interconnects 30 and land-side components 40 traversing the land side 17 to provide the necessary compete coverage.

Some formulations of curable material 36 that can be used includes underfill material used in the art between the die 20 and the carrier substrate 10, provided that it can resist the high temperatures of reflow. Curable material 36 rated to withstand a temperature of 260 C remains undamaged during a subsequent high temperature reflow process. The curable material 36 can also be "filled" with a particulate or fibrous material to provide added strength. Any curable material 36 suitable for the intended purpose can be used, including, but not limited to, UV, thermal, chemical and microwave curing material.

In another embodiment in accordance with the invention, the curable material 36 has a predetermined viscosity appropriate to form a layer of curable material 36 on the interconnect material 34 about the interconnects 30 and land-side components 40 by capillary action. The curable material 36 is drawn slightly up the interconnects 30 and land-side components 40 to form fillets 37. The fillets 37 provide structural support to the interconnects 30 and land-side components 40 when the interconnect material 34 is weakened at elevated temperature.

In another embodiment of the method in accordance with the invention, the curable material 36 is dispensed from the applicator 60 in a single circular pass 62 applied between the outer portion 11 and center portion 13, between the interconnects 30 and the land-side components 40, respectively. The curable material 36 is adapted to have a predetermined viscosity such that the curable material 36 flows by capillary action to form a layer of curable material 36 on the interconnect material 34 and about the interconnects 30 and land-side components 40. The curable material 36 is drawn slightly up the interconnects 30 and land-side components 40 to form fillets 37. The fillets 37 provide structural support to the interconnects 30 and land-side components 40 when the interconnect material 34 is weakened at elevated temperature. The curable material 36 can be applied to individual carrier assemblies 71, or, as discussed above, to a panel 10' wherein individual carrier assemblies 71 are subsequently singulated.

In accordance with the invention as shown in FIG. 4C, the curable material 36 covers the interconnect material 34 and the thickness of the curable material 36 must be sufficient to provide structural support to the interconnects 30 and interconnect legs 42 of the land-side components 40 in cases wherein the interconnect material 34 soften or melts at elevated temperatures. The thickness of the curable material 36 has to be sufficient to cover and contain the interconnect material 34 but not so thick as to interfere with the insertion of the interconnects 30 into the intended receptacle, such as a socket. The curable material 36 must not form such a high filet 37 about the interconnects 30 that the package is prevented from fully seating within a socket (not shown); a situation which would effect the electrical resistance and inductance of the electrical system.

It has been found that a layer of curable material 36 having a thickness of about 0.010 inches to about 0.015 inches provides satisfactory results. The thickness of the curable material 36, either lower or higher, is anticipated and within the scope of the invention to meet the needs of specific package configurations and conditions.

The method of dispensing the curable material 36 onto the carrier assembly 71 is not to be limited to the methods previously described. The method of dispensing the curable material 36 will depend on the specific configuration of the carrier assembly 71. For example, a carrier assembly 71 having a land side 17 comprising a full pin grid array, that is, interconnects 30 equally distributed substantially across the entire land side 17 of the carrier assembly 71, may require the application of the curable material 36 from along a peripheral edge 28 of the carrier substrate 10 and/or between the interconnects 30. Additionally, for the embodiment wherein the carrier assembly 71 are not singulated but remain as a panel 10' as shown in FIG. 2E, the application of the curable material 36 may be along the cut streets 9 between each array of interconnects 30.

Figure 5A:
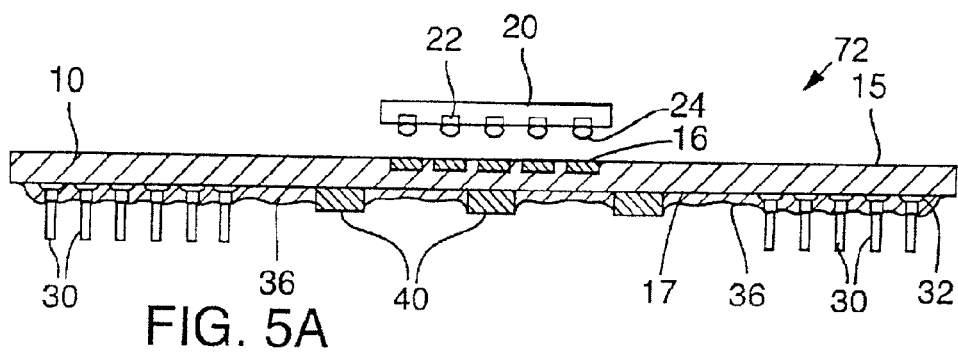
FIG. 5A is a cross-sectional exploded view of a carrier substrate comprising interconnects/components and a curable material layer in accordance with an embodiment of the invention.

FIG. 5A is a cross-sectional exploded view of the encapsulated carrier assembly 72 of FIG. 4C, comprising curable material 36 applied and cured, in accordance with the method of FIG. 1. The encapsulated carrier assembly 72 is orientated land side 17 down with the die land pads 16 facing up. The die 20 is provided with bond pads 22, each having a die reflowable electrically conductive interconnect material 24 deposited thereon. The bond pads 16 are registered or aligned with respective die land pads 16 on the carrier substrate 10. A reflow process, such as that provided by the C4 process is used to couple the die 20 to the encapsulated carrier assembly 72. During the reflow process, the carrier assembly 73 is subjected to thermal conditions commonly 10 C to 20 C higher than the melting temperature of the interconnect material 34 coupling the interconnects/components 30,40 to the carrier substrate 10. Upon heating, the die interconnect material 24 softens/melts/reflows to physically and electrically couple with the bond pads 22 and the die land pads 16 upon cooling.

The curable material 36 covers and protects the interconnect material 34 of the interconnects 30 and land-side components 40 from the high temperature of the reflow process. The curable material 36 also holds the interconnects 30 and land-side components 40 to the carrier substrate if the interconnect material 34 softens or melts during the reflow process.

Figure 5B:
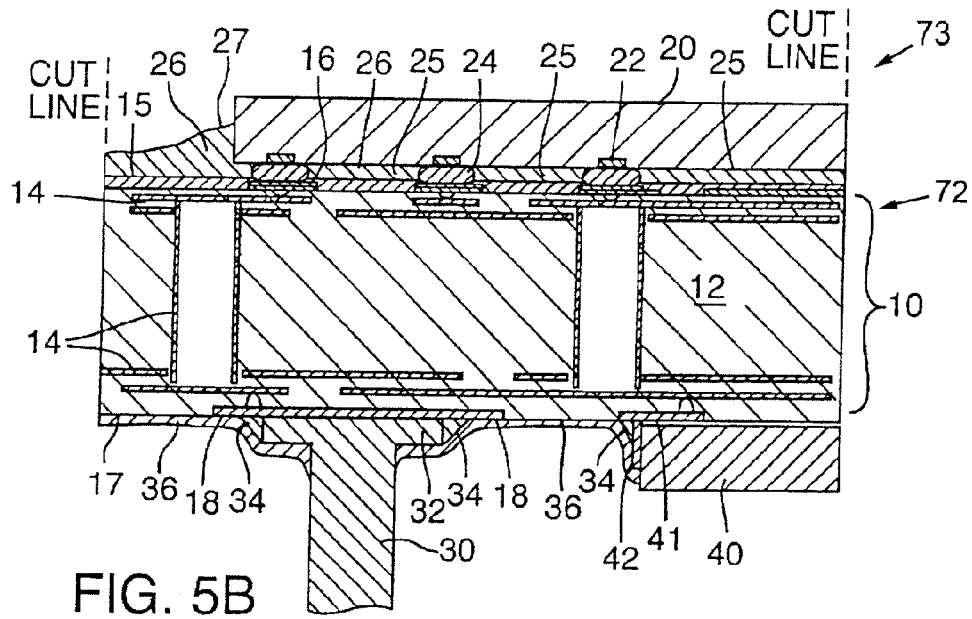
FIG. 5B is a partial cross-sectional view of a carrier substrate comprising interconnects/components and a curable material layer post-reflow and post-underfill in accordance with an embodiment of the invention.

FIG. 5B is a partial cross sectional view of a partially assembled package 73 post-coupling of the die 20 to the encapsulated carrier assembly 72. Following the reflow process, a gap 25 remains between the die 20 and the die side 15 of the carrier substrate 10. The gap 25 is provided with an underfill curable material 26, a process common in the art. Capillary action draws the underfill curable material 26 into the gap 25 and provides a fillet 27 around the perimeter of the die 20. The underfill curable material 26 is cured in accordance with the type of underfill curable material 26 used, forming a strong adhesive bond between the die 20 and the carrier substrate 10.

Figure 5C:
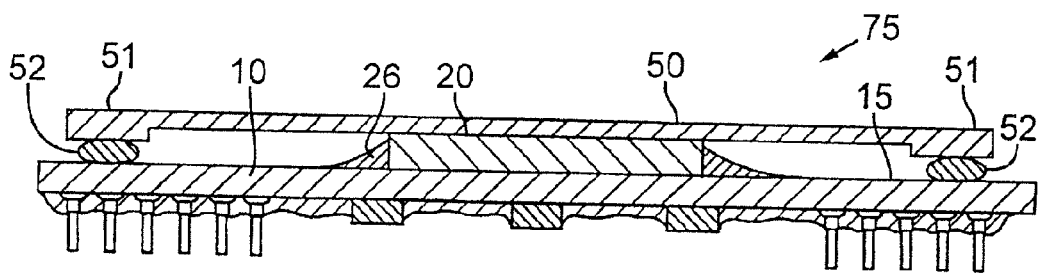
FIG. 5C is a cross-sectional view of a package comprising a carrier substrate comprising interconnects/components, a curable material layer, and a heat dissipation device, in accordance with an embodiment of the invention.

FIG. 5C is a cross-sectional view of a package 75 comprising a heat dissipation device 50 coupled to the partially assembled package 73, shown as a heat spreader. The heat dissipation device 50 is coupled to the die side 15 of the carrier substrate 10 and in thermal contact with the die 20 to provide a broad surface to augment heat dissipation from the die 20. The edges 51 of the heat dissipation device 50 are coupled to the die side 15 and acts to provides a cover that provides protection to the die 20 against the environment.

FIG. 6 is a flow diagram of a method 200 in accordance with another embodiment of the invention. A package that is produced by commonly known reflow methods is provided with a temperature-resistant curable material covering the interconnect material about the interconnects and land-side components. In other words, this method can be applied to any package that requires further high temperature processing or must withstand high temperature applications.

In accordance with the method 200, a package is provided comprising interconnects and/or land-side components coupled to a carrier substrate using reflowable electrically conductive interconnect material applying common reflow techniques 202. The package is positioned in a land-side-up orientation 204. A liquid or semi-liquid curable material is applied to cover and encapsulate the interconnect material about the interconnects and/or land-side components 206. The curable material is hardened by appropriate curing 208.

In accordance with another embodiment of the method 200, a package is provided comprising interconnects and/or land-side components coupled to a carrier substrate using reflowable electrically conductive interconnect material applying common reflow techniques 202. The package is positioned in a land-side-up orientation 204. A liquid or semi-liquid curable material is applied along a single line between the interconnects and the land-side components to cover and encapsulate the interconnect material about the interconnects and the land-side components by capillary action 212. The curable material is hardened by appropriate curing 208.

Figure 7:
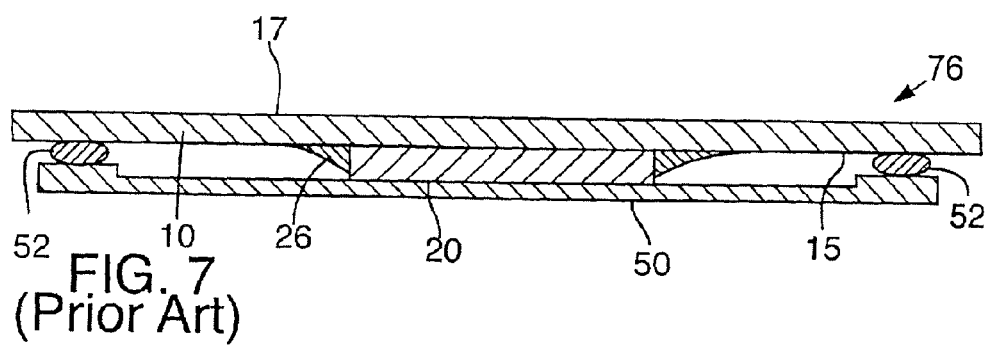
FIG. 7 is a cross-sectional view of a package prior to coupling the interconnects/components.

FIG. 7 is a cross section of an incomplete package 76; that is, prior to the attachment of the interconnects/components. The package 76 is manufactured in accordance with a known process, such as the C4 process, to couple the die 20 to the carrier substrate 10. Optionally, and as shown in FIG. 7, underfill curable material 26 is applied about and in the gap between the die 20 and the carrier substrate 10 to aid in structural support of the die 20. Additionally, a heat dissipation device 50 is coupled to the die 20 and the carrier substrate 10 which provides protection for the die 20 from the environment.

Figure 8A:
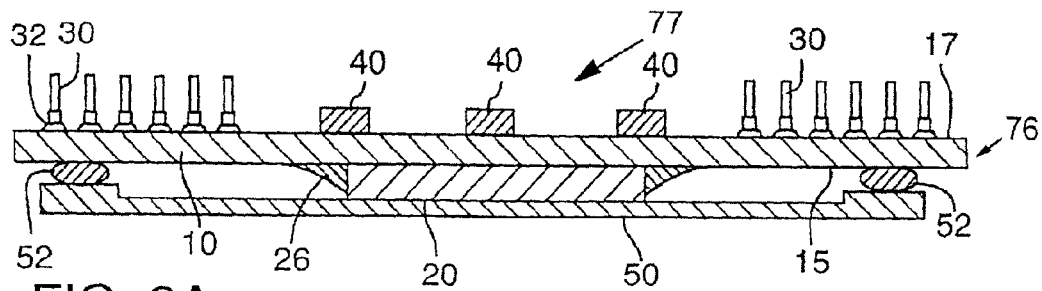
FIGS. 8A and 8B are full and partial cross-sectional views, respectively, of a package comprising interconnects/components.
Figure 8B:
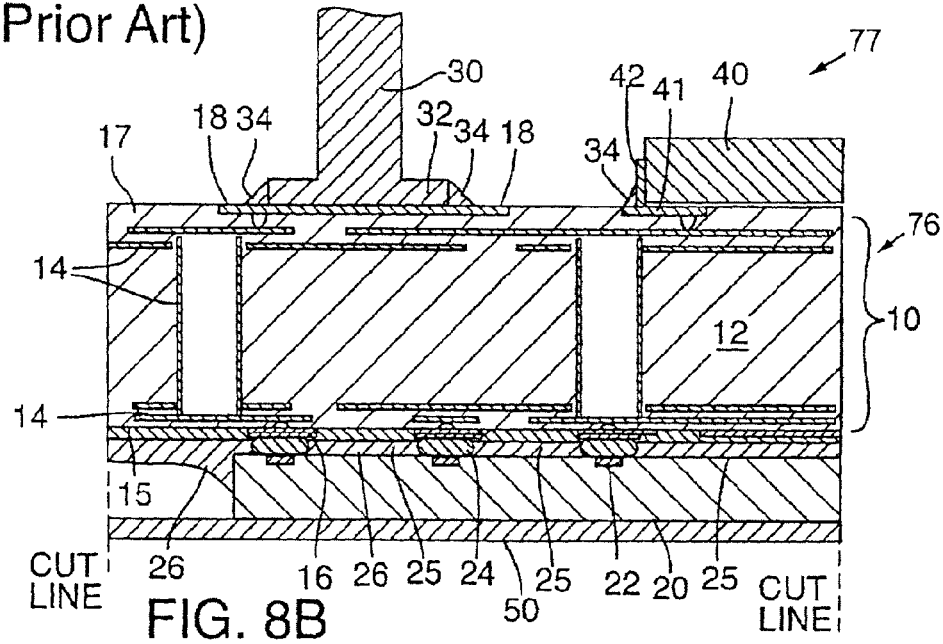

FIGS. 8A and 8B are full and partial cross-sectional views, respectively, of a package 77, shown as a FC-PGA package. The package 77 comprises the incomplete package 76 of the embodiment of FIG. 7 with interconnects 30 and the land-side components 40 coupled to the carrier substrate 10 in accordance with known reflow methods.

Figure 9A:
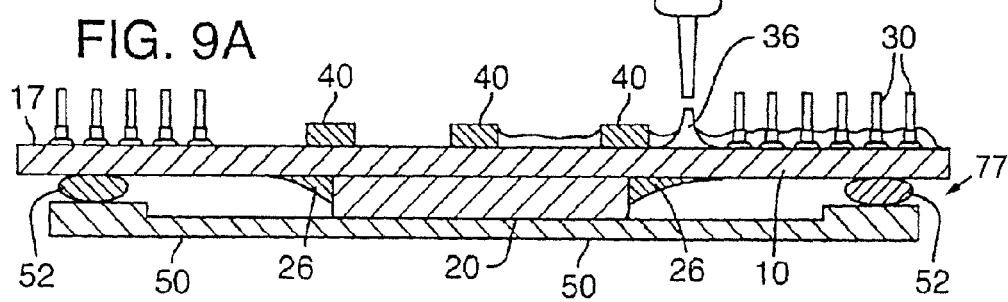
FIG. 9A is a cross-sectional view of the package comprising a curable material layer in accordance with an embodiment of the invention.
Figure 9B:
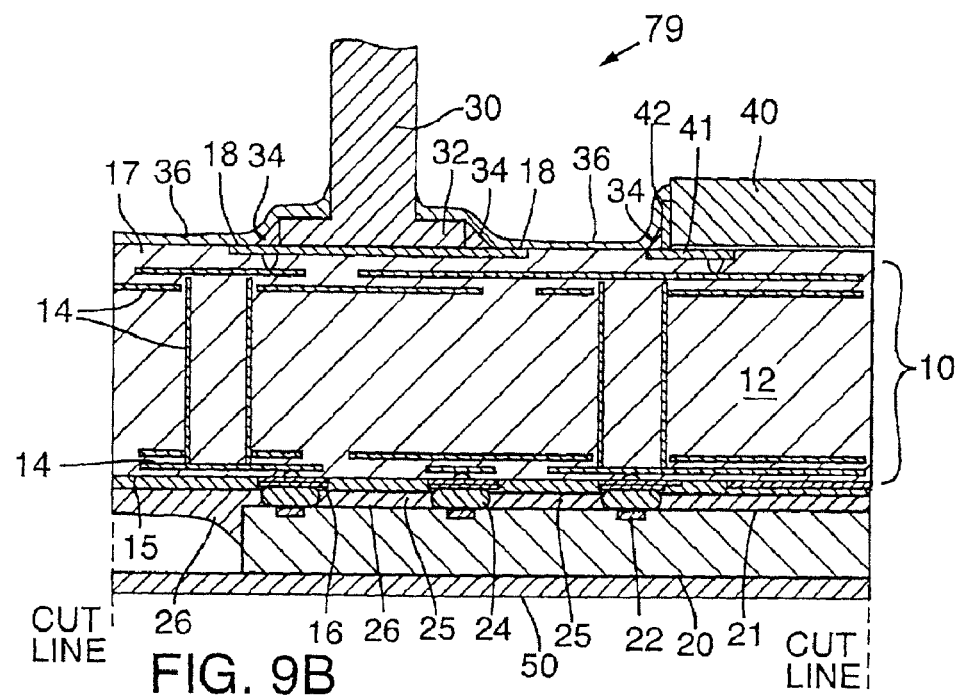
FIG. 9B is a partial cross-sectional view of a package comprising a curable material layer in accordance with an embodiment of the invention.

FIGS. 9A and 9B are cross-sectional and partial cross-sectional views of an encapsulated package 79 in accordance with an embodiment of the invention. The encapsulated package 79 comprises the package 77 of FIGS. 8A–B having a curable material 36 applied on the land side 17 covering the interconnect material 34 about the interconnects 30 and the land-side components 40. The package 77 is orientated such that the land side 17 of the carrier substrate 10 is facing up. A dispenser 60 is used to apply curable material 36 to the land side 17 in a process similar to that discussed earlier. A layer of curable material 36 is formed on the interconnect material 34 about the interconnects 30 and the land-side components 40 by capillary action or by direct application. The curable material 36 is cured in accordance with the type of curable material 36 used, encapsulating the interconnect material 34 about the interconnects 30 and the land-side components 40.

Figure 10:
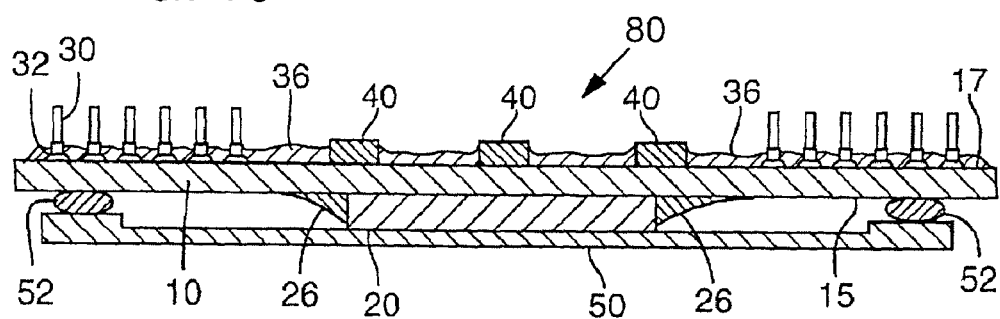
FIG. 10 is a cross-sectional view of the package comprising a curable material layer in accordance with an embodiment of the invention.

FIG. 10 is a cross-sectional view of a package 80 in accordance with the present invention. The package 80 comprises the encapsulated package 79 wherein the curable material 36 having been cured encapsulating the interconnect material 34. The package 80 can now be used in high temperature processes or applications experiencing temperatures in excess of the melting temperature of the interconnect material 34. The curable material 36 couples the interconnects/components 30,40 to the carrier substrate 10 to prevent misalignment or failed coupling caused by the interconnect material 34 becoming soft or molten at elevated temperatures.

The benefits of encapsulating the interconnect material of the interconnects and the land-side components was experimentally verified. In the experimentation, standard packages comprising pin and land-side components, such as shown in FIG. 8A, in the form of FC-BGA packages, also referred to as plan of record (POR) packages, which were manufactured according to standard practice, were compared with encapsulated packages, such as shown in FIG. 10, which were manufactured according to the methods of the present invention to encapsulate the interconnect material about the interconnects and the land-side components. The average thickness of the applied curable material was 0.012 to 0.015 inches.

The POR and encapsulated packages were evaluated for pin alignment after experiencing elevated reflow temperatures. A common measurement for pin alignment is known as pin radial true position (TPR). An average TPR for the FC-BGA package of about 0.002 inches, and a maximum of about 0.006 inches, is considered acceptable in the art.

Twenty POR packages were used as experimental controls; known as end of line (EOL) packages. Twenty encapsulated packages were produced using curable material to encapsulate the interconnect material in accordance with the methods of FIG. 6. Ten each of the POR and encapsulated packages were subjected to a reflow cycle with a maximum temperature of 240 C. Ten each of the remaining POR packages and encapsulated packages were subjected to a reflow cycle with a maximum temperature of 260 C.

Figure 11:
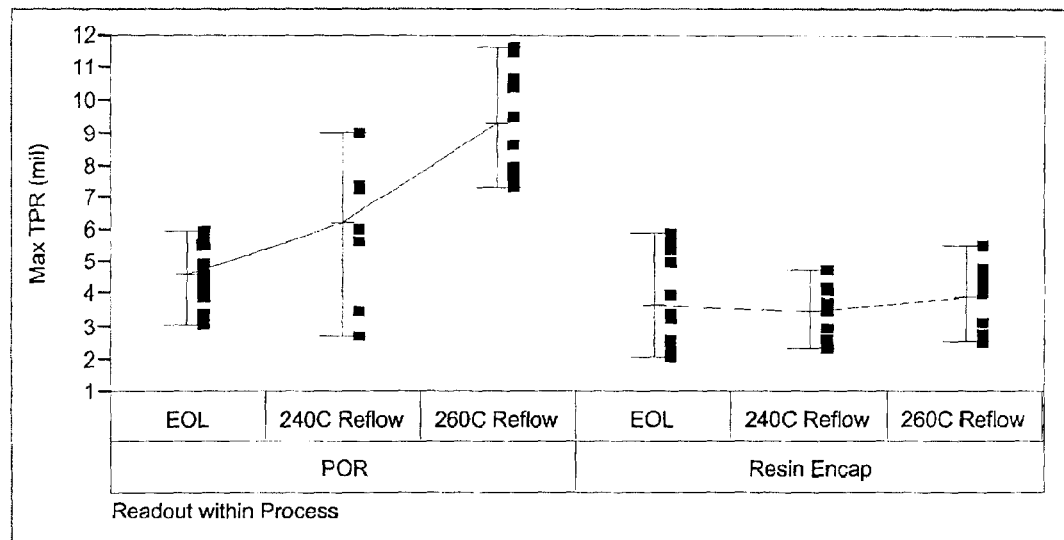
FIGS. 11 and 12 are graphical representations of validating experimental data in accordance with an embodiment of the invention.
Figure 12:
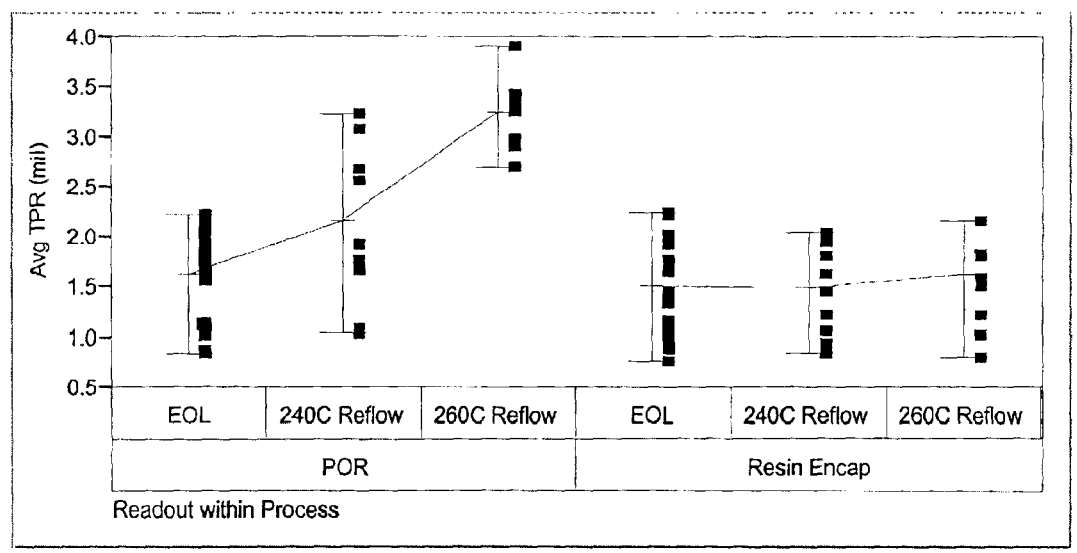

The data for maximum and average TPR are presented in FIGS. 11 and 12, respectively. It can be seen that the POR packages exhibited a maximum TPR of up to about 0.009 inches after the 240 C reflow and up to about 0.0115 inches after the 260 C reflow. The encapsulated packages exhibited a maximum TPR of about 0.006 inches after both the 240 C and 260 C reflow cycles, virtually the same TPR as the EOL packages that did not experience the reflow process.

Similarly, the POR package had an average TPR of up to about 0.00325 inches after the 240 C reflow and up to about 0.0039 inches after the 260 C reflow. The encapsulated packages resulted in an average TPR of about 0.0025 inches after the 240 C and 260 C reflow cycles, virtually the same as the EOL packages.

The TPR of the EOL packages were statistically identical with the encapsulated packages made in accordance with the present invention and exposed to the reflow conditions. The results shown in FIGS. 11 and 12 clearly demonstrate the improvement provided by encapsulating the interconnect material as practiced using the methods in accordance with the invention.

The POR packages and pin-encapsulated packages also comprise land-side components coupled and encapsulated in accordance with the method of the invention of FIG. 6. Visual observation of the condition of the land-side components revealed that the reflow process had little or no effect on the integrity of the coupling of the land-side components to the carrier substrate. Therefore, the benefits of the encapsulation of the interconnects extends to the land-side components.

It is significant to note that at the very high reflow temperatures of up to 260 C, there is corresponding potential for coefficient of thermal expansion (CTE) mismatch between the curable material and the interconnect material. This CTE mismatch has the potential to cause the interconnect material to wick-out or extrude from the curable material. This was not observed.

The encapsulation by the curable material was sufficient to prevent pin movement and corresponding pin alignment problems when the interconnect material is softened or melted, while not putting significant force on the interconnect material caused by the CTE so as to cause failure of the coupling of the interconnects/components to the carrier substrate.

Figure 13A:
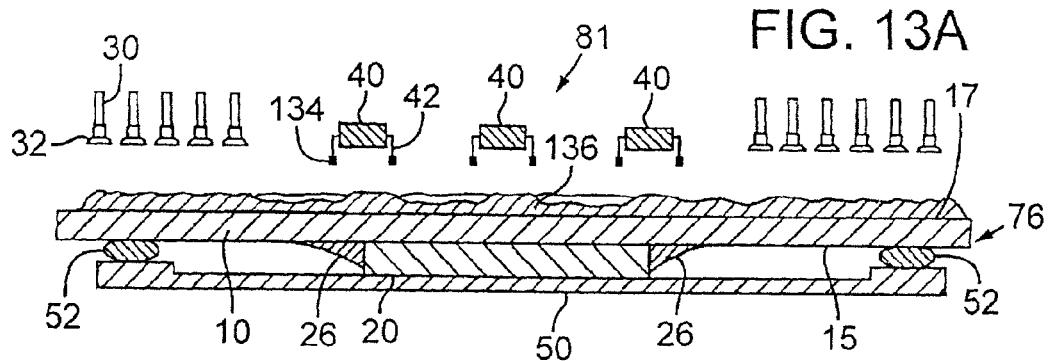
FIGS. 13A and 13B are exploded cross-sectional and cross-sectional views, respectively, of a package in accordance with an embodiment of the invention.
Figure 13B:
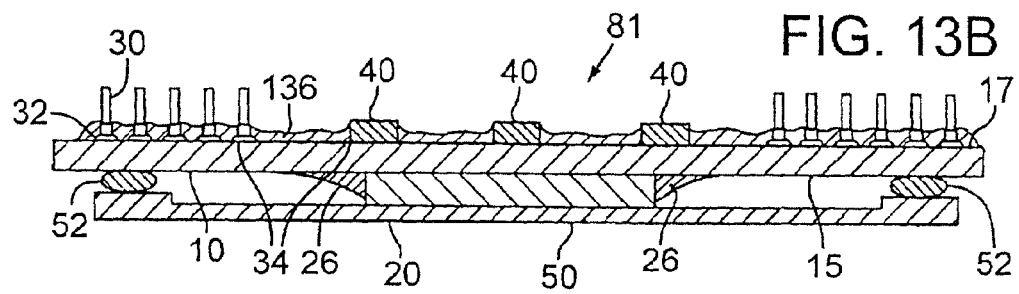

FIG. 13A is a cross-sectional exploded view of an encapsulated package 81 comprising the partially assembled package 76, in accordance with another embodiment of the invention. Prior to coupling the interconnects/components 30,40 to the partially assembled package 76, a highly viscous curable material 136 is applied to the land side 17 of the carrier substrate 10. The highly viscous curable material 136 comprises particulate reflowable electrically conductive interconnect material commixed with a curable material. The highly viscous curable material 136 is adapted such that after application onto the land side 17 of the carrier substrate 10, the highly viscous curable material 136 will substantially remain in place. The interconnects 30 and land-side components 40 are inserted through the highly viscous curable material 136 to abut respective interconnect land-pads 18 and component land-pads 41 (not shown). The encapsulated package 81 is processed at a reflow temperature sufficient to cause the interconnect material in the highly viscous curable material 136 to reflow, coupling the interconnects/components 30,40 to the interconnect/component land-pads 18,41, as well as cure the highly viscous curable material 136, encapsulating the interconnect material 34.

Figure 14A:
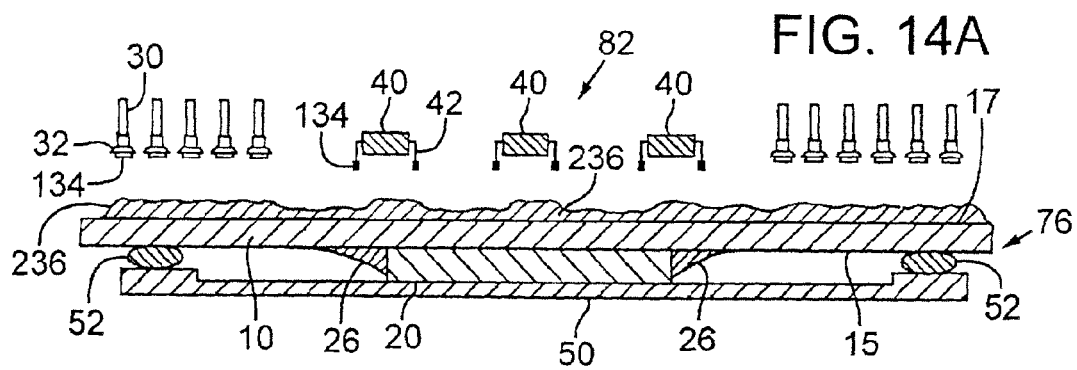
FIGS. 14A and 14B are exploded cross-sectional and cross-sectional, respectively, of a package in accordance with an embodiment of the invention.
Figure 14B:
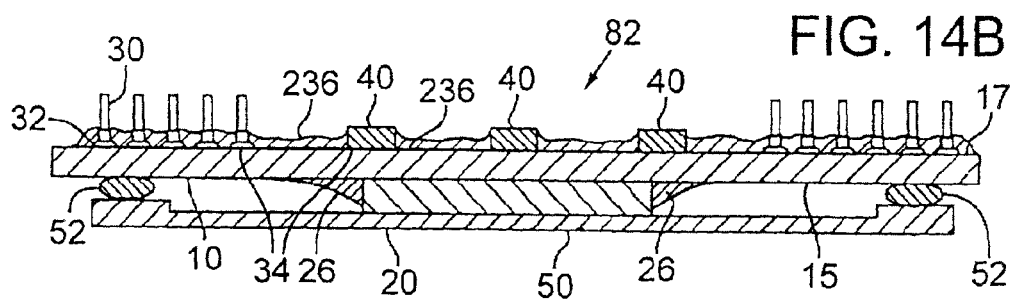

FIG. 14A is a cross-sectional exploded view of an assembly 82 comprising a partially assembled package 76, in accordance with another embodiment of the invention. Prior to coupling the interconnects/components 30,40 to the partially assembled package 76, a highly viscous curable material 236 is applied to the land side 17 of the carrier substrate 10. The highly viscous curable material 236 is adapted such that after application onto the land side 17 of the carrier substrate 10, the highly viscous curable material 236 will substantially remain in place. The interconnects/components 30,40 are provided with a layer of reflowable electrically conductive interconnect material 134 on the pin head 32 and on the land-side component interconnect legs 42. The interconnects 30 and the interconnects legs 42 are inserted through the highly viscous curable material 236 such that the interconnect material 134 on the interconnects/components 30,40 abuts the respective interconnect land-pads 18 and component land-pads 41. The partially assembled package 76 is processed at a reflow temperature sufficient to cause the interconnect material 134 to reflow and couple the interconnects 30 to the interconnect land-pads 18 and the legs 42 to the component land-pads 41, as well as cure the highly viscous curable material 236, encapsulating the interconnect material 34.

The present description describes the use of a curable material capable of withstanding reflow temperatures. It is recognized that there are many types of materials suitable for the particular purpose. Therefore, the curable material described in the detailed description is not to be taken in a limiting sense. One example of a suitable material is a curable liquid or semi-solid dispensable/film type adhesive. The adhesive material composition comprises one or more of, but not limited to, epoxy resin, fillers such as silica particles, curing agents such as anhydride/amine/phenol polymers, and coupling agents. The curable material may further comprise monomeric or oligomeric hardners which facilitates the curing process by decreasing the volatilization of the composition. Further, controlling the amount of oligomeric hardners and/or polymers in the curable material effects cross-linking of the material, which can be formulated to modify viscosity, moisture absorption, volatilization and modulus, mechanical properties, and/or adhesion. The curable material may also comprise catalysts for promoting cross-linking and to control cure time, elastomers for toughening, and/or fluxing agents, and other additives for flow modification, adhesion and, for UV curable resins, photo labile/active compounds. The curable material may also have a high glass transition temperature ($T_g$), and high degradation temperature, thereby resulting in a robust material for 260° C. reflow conditions.

Microelectronic packages made in accordance with embodiments of the present invention provides a variety of benefits. A carrier substrate comprising land-side components and interconnects in the form of pins can now be exposed to temperatures approaching and exceeding the melting temperature of the interconnect material coupling the interconnects/components to the carrier substrate without detrimental effect to the integrity of the coupling of the interconnects and the land-side components. The methods of the present invention negates the need for interconnect rework due to interconnect failure or misalignment due to thermal conditions. Further, the interconnects and the land-side components can be coupled by the carrier substrate manufacturer and not the manufacture who couples the die to the carrier substrate, reducing die scrap rates and increasing manufacturing speed.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A microelectronic package, comprising:
    a carrier substrate comprising a land side and a die side opposite the land side;
    a pin coupled to the land side of the carrier substrate with reflowable electrically conductive interconnect material; and
    a layer of curable material in a hardened state covering the interconnect material about the pin and adapted to contain the pin from de-coupling with an interconnect land pad on the surface of the land side of the carrier substrate at temperatures exceeding the melting temperature of the interconnect material.

2. The microelectronic package of claim 1, further comprising a land-side component, the land-side component coupled to the land side of the carrier substrate with reflowable electrically conductive interconnect material, the layer of curable material covering the interconnect material about the land-side component, the curable material in a hardened state adapted to contain the land-side component from de-coupling from decoupling with a component land pad on the land side of the carrier substrate at temperatures exceeding the melting temperature of the interconnect material.

3. The microelectronic package of claim 1, further comprising a microelectronic die coupled to the die side of the carrier substrate.

4. The microelectronic package of claim 3, further comprising a heat dissipation device coupled to the die.

5. The microelectronic package of claim 1, wherein the pin is a selected one of flat-headed pin and a through-hole pin.

6. The microelectronic package of claim 1, wherein the pin is a pin of a flip chip-pin grid array package.

7. The microelectronic package of claim 1, wherein the reflowable electrically conductive interconnect material is selected from the group consisting of lead-free solder and solder comprising lead.

8. The microelectronic package of claim 1, wherein the layer of curable material covering the interconnect material about the interconnects is at least 0.010 inches thick.

9. The microelectronic package of claim 1, wherein the curable material has a predetermined viscosity such that the curable material forms a fillet about the pin.

10. The microelectronic package of claim 1, further comprising:
    a land-side component;
    a microelectronic die;
    a heat dissipation device coupled to the die, the land-side component coupled to the land side of the carrier substrate with reflowable electrically conductive interconnect material, the layer of curable material in a hardened state covering the interconnect material about the land-side component, and adapted to contain the land-side component from de-coupling from a component land pad on the land side of the carrier substrate at temperatures exceeding the melting temperature of the interconnect material, and
    wherein the curable material has a predetermined viscosity such that the curable material forms fillets about the pin and land-side component.

11. A substrate for use in manufacturing microelectronic packages, comprising:
    a land side and a die side opposite the land side, the land side comprising a plurality of interconnect land pad arrays, each interconnect land-pad array comprising a plurality of interconnect land pads;
    a pin coupled to each of a plurality of the interconnect land pads with reflowable electrically conductive interconnect material; and
    a layer of curable material in a harden state covering the interconnect material about the pins, the curable material adapted to contain each of the pins from decoupling with each of the plurality of interconnect land pads at temperatures exceeding the melting temperature of the interconnect material.

12. The substrate of claim 11, further comprising land-side components, wherein each interconnect land pad array further comprises a plurality of component land-pads, the land-side components coupled to a plurality of the component land-pads with reflowable electrically conductive interconnect material, the layer of curable material covering the interconnect material about the land-side components, the curable material adapted to contain the land-side components from de-coupling with each of the plurality of component land-pads at temperatures exceeding the melting temperature of the interconnect material.

13. The substrate of claim 12, the die side comprising a plurality of die land-pad arrays corresponding to the interconnect land pad arrays, one die land-pad array being opposite to one interconnect land pad array, each die land-pad array comprising a plurality of die land pads.

14. The substrate of claim 13, further comprising a microelectronic die having an array of bond pads in complimentary relationship to one die land-pad array, the bond pads and the die land pads coupled with reflowable electrically conductive interconnect material.

* * * * *

UNITED STATES PATENT AND TRADEMARK OFFICE
CERTIFICATE OF CORRECTION

PATENT NO. : 6,911,726 B2
APPLICATION NO. : 10/165401
DATED : 06/28/2005
INVENTOR(S) : Rumer et al.

It is certified that error appears in the above-identified patent and that said Letters Patent is hereby corrected as shown below:

<u>In the Claims:</u>
Col. 11, lines 59-60, "...from de-coupling from decoupling with..." should read
--...from decoupling with...--.

Signed and Sealed this

Twenty-second Day of August, 2006

JON W. DUDAS
*Director of the United States Patent and Trademark Office*